United States Patent [19]
Glass

[11] Patent Number: 5,621,765
[45] Date of Patent: Apr. 15, 1997

[54] DETECTOR OF THE PRESENCE OF A TRANSMISSION IN A MODEM

[75] Inventor: William Glass, Seyssinet Pariset, France

[73] Assignee: SGS-Thomson Microelectronics S.A., Saint Genis, France

[21] Appl. No.: 526,505

[22] Filed: Sep. 11, 1995

[30] Foreign Application Priority Data

Sep. 14, 1994 [FR] France ................... 94 11211

[51] Int. Cl.$^6$ .............. H03K 9/00; H04L 27/06; H04L 27/14; H04L 27/72

[52] U.S. Cl. ............................ 375/317; 375/222

[58] Field of Search ................... 375/219–223, 375/224–227, 259, 285, 317, 261, 346, 350; 455/73, 74, 78, 79, 214, 277.2, 278, 283, 284, 296; 329/304–307, 310

[56] References Cited

U.S. PATENT DOCUMENTS

| | | | |
|---|---|---|---|
| 4,534,034 | 8/1985 | Krishnan | 364/724 |
| 4,541,101 | 9/1985 | Potage et al. | 455/222 |
| 4,674,103 | 6/1987 | Chevillat et al. | 364/724 |
| 4,969,207 | 11/1990 | Sakamoto et al. | 455/134 |
| 5,018,190 | 5/1991 | Walker | 379/95 |
| 5,040,194 | 8/1991 | Tjahjadi et al. | 455/240 |

OTHER PUBLICATIONS

French Search Report from French Patent Application No. 94 11211, filed Sep. 14, 1994.

*Primary Examiner*—Tesfaldet Bocure
*Assistant Examiner*—Bryan Webster
*Attorney, Agent, or Firm*—David M. Driscoll; James H. Morris

[57] ABSTRACT

A detector of the presence of a transmission in a modem, including a circuit for determining the absolute value of a receive signal, a first averaging block of the absolute value and two first comparators with respect to two predetermined detection and loss thresholds of a transmission, and further including a second averager which is associated with two second comparators with respect to predetermined extreme thresholds which englobe the two detection and loss thresholds, the first averager having a high time constant with respect to the time constant of the second averager.

55 Claims, 2 Drawing Sheets

DETECTOR OF THE PRESENCE OF A TRANSMISSION IN A MODEM

BACKGROUND OF THE INVENTION

1. Field of the Invention

The present invention relates to the field of digital modulators/demodulators (modems) and more specifically to the operation of detecting the presence of a transmission within the modem receiver.

2. Discussion of the Related Art

In a modem using a signal processor, the data to be transmitted is digitally coded from a number of possible symbols, then transmitted as samples of portions of a carrier modulated in phase and amplitude (QAM) or in phase difference (DPH), then converted into analog signals.

On the receive side, the end of a transmission, or the interruption of a transmission, should be likely to be detected. The detection is performed on the basis of the energy of the receive signal. A transmission detector indicates through an output with two states, respectively ON and OFF, the presence or the absence of a transmission, which is characterized by the presence or the absence of a carrier.

Each communication standard determines a minimum threshold for the signal level, below which the transmission is to be regarded as interrupted. The threshold is, for example, −48 dBm for standard V27. The standard also fixes a maximum delay for identifying the transmission loss, for example from 5 to 15 ms for standard V27, and a maximum threshold above which the modem is to assume that a (ON or OFF) indicating whether a transmission is occurring or not. State machine 4 interprets the result of the comparisons of a current cycle by using, when the energy level is between the detection DETH and loss LOSSTH thresholds, the value of the previous OUT detection signal during the previous cycle in order to determine, through the evolution of the level, whether there is loss or detection of a transmission.

A problem to solve in conventional detectors is that the necessary presence of averaging block 3 obliges to compromise between respecting the switching time of the detector and the accuracy of the detector.

Indeed, a recursive first order low-pass digital filter is constituted, as shown in FIG. 1, by an integrator 5 associated with two multipliers 6 and 7 and to a shift register 8. The signal to be filtered is multiplied by a coefficient k, which is lower than 1, before being sent on a first input of integrator 5. A second input of integrator 5 receives its own output signal, multiplied with a coefficient 1-k, and delayed by register 8. The value of coefficient k determines not only the time constant of the filter, but also the ripple of the output signal of the filter.

Indeed, the lower the coefficient k, the lower the contribution of the current input value, and the longer it will take for the output of averaging block 3 to reach the input value. Thus, k must be selected with a big enough value to comply with the constraint on the detector switching time (from 5 to 15 ms for the V27 standard).

In contrast, the greater the value of coefficient k, the more the output signal of averaging block 3 will comprise strong ripple as an effect of the contribution of the current input value when the receive signal is modulated. Hence, k must be selected with a small enough value transmission occurs. The maximum threshold is for example −43 dBm for standard V27. Moreover, the switching of the detector must occur with a minimum hysteresis of 2 dB. In other words, the switching of the detector from its OFF position to its ON position must happen at a level which is at least 2 dB higher than the switching level of the detector from its ON position to its OFF position. The use of two thresholds is linked to the ripple exhibited by the signal indicating the energy of the receive signal, because of the carrier modulation.

All these constraints lead to the requirement that the detector of the presence of a transmission be able to both switch rapidly and be sufficiently accurate.

FIG. 1 schematically shows a conventional detector of the presence of a transmission in a modem. The detector includes an energy calculation circuit 1 including a circuit 2 for determining the absolute value (supplying the absolute value of the receive signal Rx), having its output sent on an averaging block 3 constituted by a first order recursive low-pass filter with a zero cut-off frequency. The signal Rx received by energy calculation circuit 1 corresponds to the signal received by the modem after digitization. Averaging block 3 is used to smooth the ripple at the output of circuit 2, as well as to avoid an ill-timed switching of the detector. Two comparators C1 and C2 of the detector receive, each one on a positive input, the output of averaging block 3 which constitutes the output of energy calculation circuit 1 for the receive signal Rx. The negative input of each comparator C1 and C2 receives a threshold value, respectively for detection (DETH) and loss (LOSSTH), with which the energy of the receive signal is to be compared. The output of the two comparators C1 and C2 is sent to a state machine 4 having the role of issuing an OUT detection signal with two states to avoid an output signal ripple of averaging block 3 would cause an ill-timed switching of comparators C1 or C2. The values of thresholds DETH and LOSSTH of comparators C1 and C2 are generally chosen inside the range separating the thresholds fixed by the standard (−43 dBm and −48 dBm for standard V27) with a distance from each other of a value greater than that of the required hysteresis (that is, >2 dB for standard V27). For example, for the V27 standard, the detection threshold DETH is fixed at −44 dBm and the loss threshold LOSSTH is fixed at −47 dBm.

Moreover, the higher the rate of the modulated signal, the more the peak factor of the receive signal increases and the more the ripple amplitude of the output signal of averaging block 3 increases. Accordingly, the more the rate increases, the lower coefficient k must be. Complying with this last requirement, in presence of a modulated signal with a rate of 2400 bits per second, would lead for the V27 standard to adopt a value of 0.002 for k. This would bring about a time constant, or response time, of 240 ms for the filter, instead of the required maximum 15 ms. This phenomenon is even more important in the case of a QAM modulation (for example, according to the V17 standard) than in the case of a DPH modulation (for example, according to the V27 standard).

The compromise which must then be made leads for the conventional detectors to only meet the specified requirements with a pure, i.e. non modulated, carrier. The time constant of the filter is set in order to comply with the constraint on the switching time, at the expense of the filter accuracy in presence of a modulated signal.

SUMMARY OF THE INVENTION

In one illustrative embodiment of the invention, a circuit for determining when a transmission signal is received is provided, comprising at least one circuit for determining the average of a signal received by the device, a first pair of comparators for comparing the average of the signal received against a first pair of predetermined thresholds including a first upper threshold and a first lower threshold, a second pair of comparators that compare the average of the signal received against a second pair of predetermined thresholds including a second upper threshold and a second lower threshold, and a controller that asserts and deasserts a reception signal indicating the presence of the transmission signal. The reception signal is asserted by the controller when the energy of the signal received is greater than the first upper threshold, and when the energy of the signal received is less than the first upper threshold and greater than the second upper threshold. The reception signal is deasserted by the controller when the energy of the signal received is less than the first lower threshold, and when the energy of the signal received is greater than the first lower threshold and less than the second lower threshold.

In another illustrative embodiment of the invention, a system including a modem and a circuit for determining whether a transmission signal is received at the modem input is provided. The circuit for determining whether a transmission signal is received at the modem input comprising at least one averaging circuit for determining the energy of a modem signal received by the modem, a first pair of comparators that compare the average of the modem signal against a first pair of predetermined thresholds including a first upper threshold and a first lower threshold, a second pair of comparators that compare the average of the modem signal against a second pair of predetermined thresholds including a second upper threshold and a second lower threshold, and a controller that asserts or deasserts a reception signal indicating the presence of the transmission signal. The reception signal is asserted by the controller when the energy of the modem signal is greater than the first upper threshold, and when the energy of the modem signal is less than the first upper threshold and greater than the second upper threshold. The reception signal is deasserted by the controller when the energy of the modem signal is less than the first lower threshold, and when the energy of the modem signal is greater than the first lower threshold and less than the second lower threshold.

In another illustrative embodiment of the invention, a method for determining whether a transmission signal is received at device input is provided. The method comprising the steps of: (a) comparing the energy of a signal received at the device input against a first pair of predetermined thresholds including a first upper threshold and a first lower threshold; (b) when the energy of the signal received is greater than the first upper threshold, indicating that the transmission signal is received at the device input; (c) when the energy of the signal received is less than the first lower threshold, indicating that the transmission signal is not received at the device input; and (d) when the energy of the signal received is between the first upper and lower thresholds, comparing the energy of the signal received against a second pair of thresholds including a second upper threshold and a second lower threshold, and when the energy of the signal received is greater than the second upper threshold, indicating that the transmission signal is received, and when the energy of the received signal is less than the second lower threshold, indicating that the transmission signal is not received.

In another illustrative embodiment of the invention, a circuit for determining when a transmission signal is received at a device output is provided, comprising first means for comparing the energy of an input signal against a first pair of predetermined thresholds including a first upper threshold and a first lower threshold, second means for comparing the energy of an input signal against a second pair of predetermined thresholds including a second upper threshold and a second lower threshold, and control means for asserting and deasserting a reception signal indicating the presence of the transmission signal. The reception signal is asserted by the control means when the energy of the signal received is greater than the first upper threshold, and when the energy of the signal received is less than the first upper threshold and greater than the second upper threshold. The reception signal is deasserted by the control means when the energy of the signal received is less than the first lower threshold, and when the energy of the signal received is greater than the first lower threshold and less than the second lower threshold.

In one illustrative embodiment of the present invention, a detector of the presence of a transmission in a modem is provided, including a circuit for determining the absolute value of a receive signal, a first averaging block of said absolute value and two first comparators with respect to two predetermined thresholds for the detection and the loss of a transmission, and further including a second averaging block which is associated to two second comparators with respect to predetermined extreme thresholds which encompass the two detection and loss thresholds, the first averaging block having a high time constant with respect to the time constant of the second averaging block.

According to another embodiment of the invention, the detector includes a state machine issuing a two-state detection signal based on the results coming from the four comparators, each extreme comparator having priority over the first comparator with the closest detection or loss threshold.

According to a further embodiment of the invention, each averaging block is constituted by an integrator, a first input of which receives the current absolute value of the receive signal assigned with a coefficient lower than 1, and a second input which receives the previous output value of the integrator assigned with a coefficient representing the difference between 1 and the coefficient assigned to the first input.

According to another embodiment of the invention, the time constant of the first averaging block is about 10 to 30 times greater than that of the second averaging block.

According to an additional embodiment of the invention, the distance between each extreme threshold and the closest detection or loss threshold has a value representing at least the difference between the amplitudes of the second averaging block ripple and of the first averaging block ripple, in the presence of a modulated receive signal.

According to a further embodiment of the invention, the time constant of the first averaging block is included between 100 and 300 ms, and the time constant of the second averaging block is between 5 and 15 ms.

According to another embodiment of the invention, the interval between the values of the detection and loss thresholds of the first two comparators is greater than 2 dB.

The foregoing and other objects, features and advantages of the present invention will be discussed in the following description of specific embodiments, taken in conjunction with the accompanying drawings but not limited by them.

DETAILED DESCRIPTION

Figure 1:
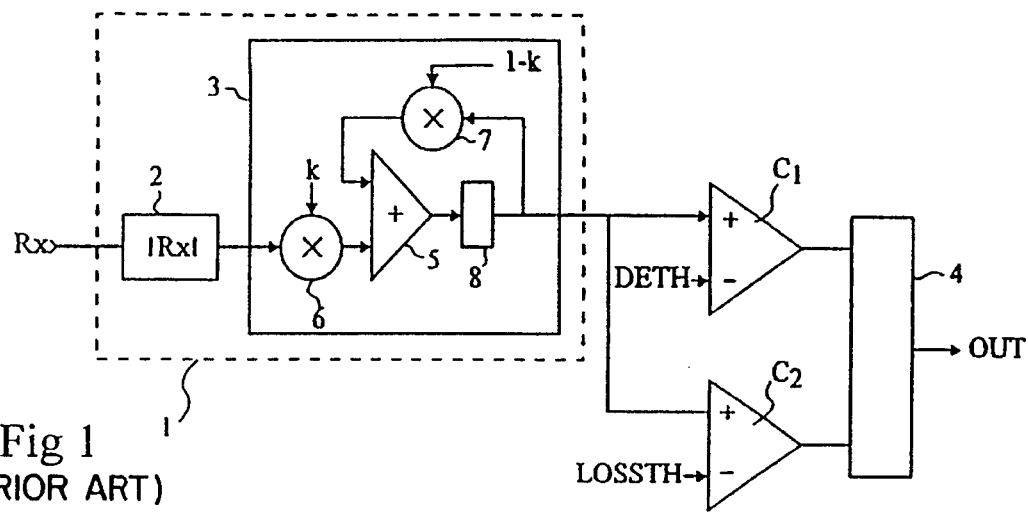
FIG. 1, previously described, discloses a prior art detector.
Figure 2:
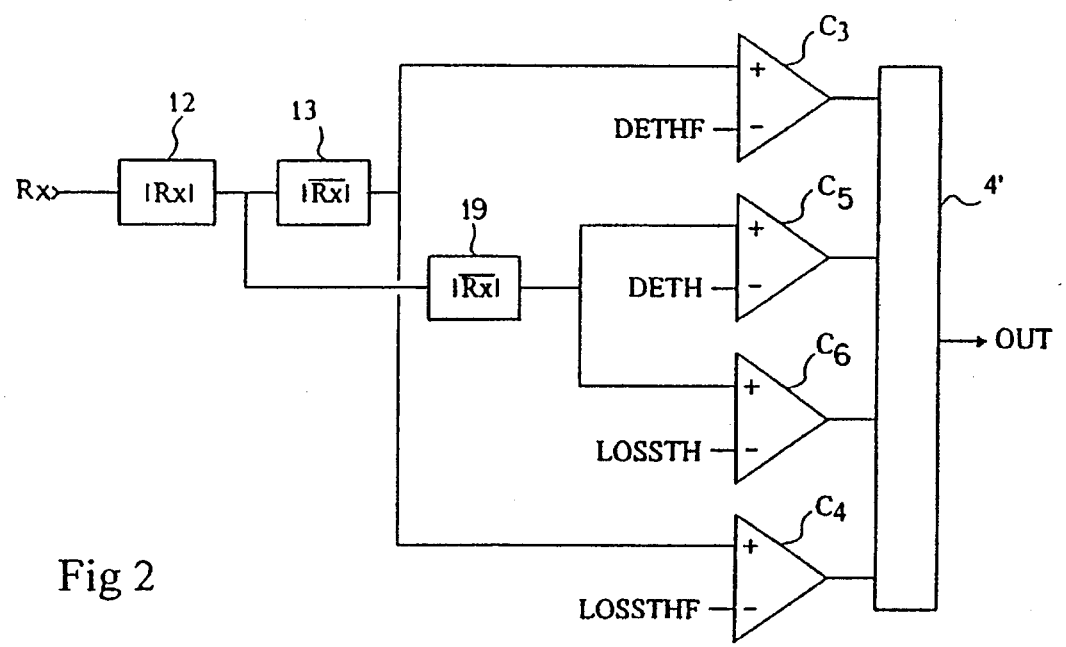
FIG. 2 schematically shows an embodiment of a detector of the presence of a transmission according to the invention.

Referring to FIG. 2, a detector according to the invention is characterized by the presence of two averaging blocks 13 and 19, each one being associated with two comparators, respectively C3, C4 and C5, C6. A first averaging block 19 is dimensioned so as to be very accurate, i.e. with a high time constant, and is associated with two first comparators C5 and C6, the thresholds of which correspond to the usual detection DETH and loss LOSSTH thresholds. A second averaging block 13 is dimensioned so as to be fast, i.e. with a low time constant, and is associated with two second comparators C3 and C4, with their thresholds DETHF and LOSSTHF corresponding to extreme values chosen beyond the values required by the standard.

Thus, a quick comparison on extreme threshold values DETHF and LOSSTHF which englobe the detection DETH and loss LOSSTH threshold is performed, since if the extreme thresholds are reached, one is ensured to be in the corresponding situation. In contrast, a slower comparison is proceeded to between the two extreme values DETHF and LOSSTHF with respect to the detection DETH and loss LOSSTH thresholds.

The outputs of comparators C5, C6, C3 and C4 are sent to a state machine 4 that issues, an OUT detection signal with two states ON and OFF. The two averaging blocks 13 and 19 receive the absolute value of the receive signal Rx issued by a circuit 12 for determining the absolute value. Only one circuit 12 may be used for determining the absolute value, the output of which is sent on the inputs of each averaging block 13 and 19. Additionally, one circuit for determining the absolute value for each averaging block 13 and 19.

Averaging blocks 13 and 19 are constituted by an integrator associated with two multipliers, each averaging block 13 or 19 respectively exhibiting a coefficient k or k' determining its time constant.

The interval between each extreme threshold, respectively DETHF and LOSSTHF, and, respectively the closest detection DETH and loss LOSSTH threshold to it is determined by the difference between the maximum peak amplitude of the ripple of the fast averaging block 13 and the maximum peak amplitude of the ripple of the slow averaging block 19. This is done in order to avoid bringing in an uncertainty in the detection caused by an overlapping of the ripple of averaging blocks 13 and 19.

The dimensioning of averaging blocks 13 and 19 and the determining of the values of the thresholds of comparators C5, C6, C3, C4, are performed on the basis of these operating constraints and of the constraints fixed by the standard.

Figure 3:
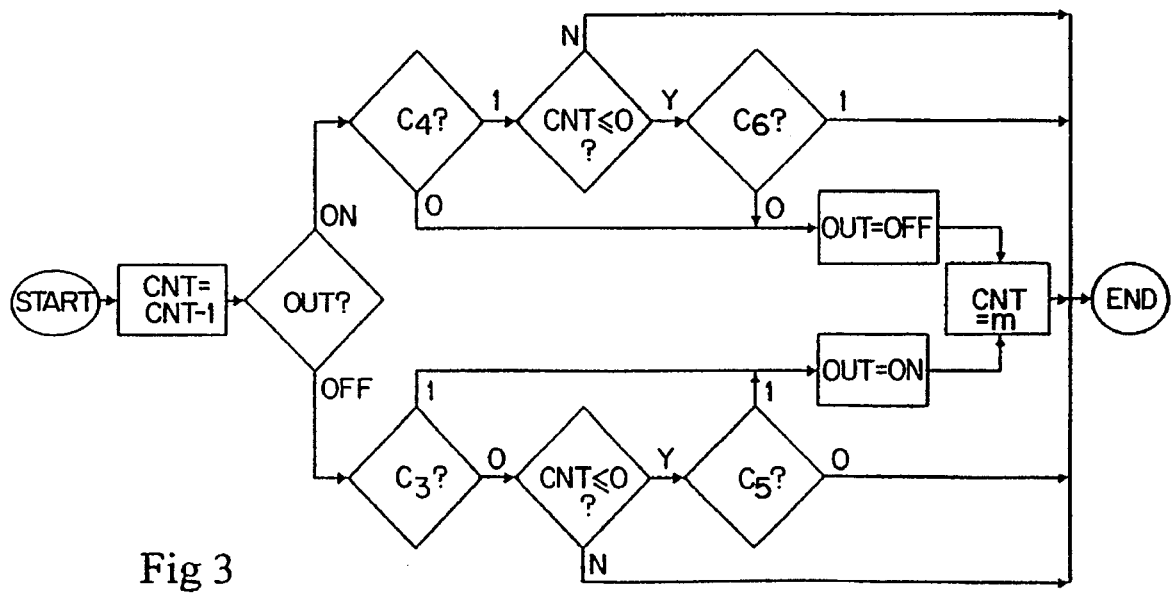
FIG. 3 is a block diagram illustrating the operation of an embodiment of a detector according to the invention.

FIG. 3 is a block diagram illustrating an example of an embodiment of the detector according to the invention, which allows the determination of the features of the state machine 4' in order to obtain the OUT detection signal. For the purposes of this figure, comparators C5, C6, C3, C4, have been assumed to be in a high output state (1) when their positive input becomes greater than the threshold sent on their negative input, and in a low output state (0) in the opposite case.

A counter CNT is decremented each time a cycle begins. Said counter is initialized at a given value m (for example, 1000) each time the state of the OUT detection signal changes. The role of the counter is to prevent the OUT detection signal from oscillating between its two states ON and OFF while the slow averaging block 19 settles after a switching triggered by comparators C3 and C4 associated with the fast averaging block 13. This role will be better understood in relation with FIGS. 4A and 4B.

At the beginning (START) of each cycle, counter CNT is decremented by 1 and a first test is performed on the state machine 4' according to the previous state of the OUT detection signal.

If, at the end (END) of the previous cycle, the OUT detection signal was in its OFF state indicating an absence of transmission, the output of comparator C3 is examined.

If the output of comparator C3 indicates an overrange of threshold DETHF, that is, if the energy of the receive signal Rx is greater than threshold DETHF, a transmission is assumed to be occurring. The OUT detection signal is then positioned in its ON state and counter CNT is reinitialized to value m.

If, conversely, the energy of the receive signal Rx is lower than threshold DETHF, the state of counter CNT is then examined. If the counter is not lower than or equal to 0, that is, if the number of cycles performed since the last switching of the OUT detection signal is lower than value m, the detection signal is kept in its OFF state. If the counter is lower than or equal to 0, that is, if the state of the detection signal has not changed for m cycles, the output of comparator C1 is examined. If this output indicates an overrange of threshold DETH, that is, if the energy of the receive signal Rx is greater than detection threshold DETH, the OUT detection signal is positioned in its ON state and counter CNT is reinitialized at value m. In the opposite case, the OUT detection signal is kept in its OFF state.

Now assuming that, during the previous cycle, the OUT detection signal was in its ON state indicating the presence of a transmission, the output of comparator C4 is examined.

If the output of said comparator C4 indicates an overrange of threshold LOSSTHF, that is, if the energy of the receive signal Rx is lower than threshold LOSSTHF, the transmission is assumed to have disappeared. The OUT detection signal is then positioned in its OFF state and counter CNT is reinitialized to value m.

If, conversely, the energy of the receive signal Rx is greater than threshold LOSSTHF, the state of counter CNT is examined. If the counter is not on 0, that is, if the number of cycles performed since the last switching of the OUT detection signal is lower than value m, the detection signal is kept in its ON state. If the counter is lower than or equal to 0, that is, if the state of the detection signal has not changed for m cycles, the output of comparator C6 is examined. If said output indicates an overrange of threshold LOSSTH, that is, if the energy of the receive signal Rx is lower than threshold LOSSTH, the OUT detection signal is then positioned in its OFF state and counter CNT is reinitialized at value m. In the opposite case, the OUT detection signal is kept in its ON state.

Thus, it can be seen that a first step is to examine the result of the comparison of the output of the fast averaging block 13 with the extreme thresholds DETHF and LOSSTHF in order to authorize, in case the thresholds are overranged, an immediate switching of the detection signal. The output of the slow averaging block 9 is used only when the energy of the receive signal is included between the two extreme thresholds DETHF and LOSSTHF. Strong ripple on the output of the fast averaging block 13 is not a nuisance in this case, since the extreme thresholds DETHF and LOSSTHF are set in such a way that the ripple of the fast averaging block 13 does not overlap the ripple of the slow averaging block 19. In other words, the changes of states of comparators C3 and C4 respectively have priority before comparators C5 and C6. Moreover, the state of comparator C5 or C6 is not taken into account unless the detection signal has been in the same state for a given number of cycles. A both reliable and fast detection of the presence of a transmission is thus obtained.

For example, the time constant of the slow averaging block 19 is fixed, as a function of the transmission rate, in order for its maximum ripple peak amplitude not to exceed the hysteresis required by the standard (2 dB for standard V27). The values of the detection DETH and loss LOSSTH thresholds are conventionally selected according to said hysteresis by being respectively lower and greater than the values fixed by the standard (for example, −43 dBm and −48 dBm for standard V27). In other words, the values of the detection DETH and loss LOSSTH thresholds (for example, −44 dBm and −47 dBm for standard V27) are selected so that with a level of the receive signal corresponding to the average of the two thresholds (for example, −44.5 dBm), the interval between the maximum level of the ripple of the slow averaging block 9 and each of the thresholds DETH and LOSSTH corresponds to at least half the hysteresis required by the standard.

The time constant of the fast averaging block 13 is fixed to be consistent with the detection time fixed by the standard (from 5 to 15 ms for standard V27). The maximum ripple peak amplitude of the fast averaging block 13 can then be inferred therefrom as a function of the transmission rate. This allows the determination of the values of the extreme thresholds DETHF and LOSSTHF. The values of the extreme thresholds DETHF and LOSSTHF are selected in the same way as the values of the detection DETH and loss LOSSTH thresholds. In other words, the values of the extreme thresholds DETHF and LOSSTHF (for example, −39 dBm and −52 dBm) are selected so that with a receive signal level corresponding to the average of the two thresholds (for example, −44.5 dBm), the interval between the maximum level of the ripple of the fast averaging block 13 and each of the thresholds DETHF and LOSSTHF corresponds to at least half the hysteresis required by the standard.

Applying these rules leads to having a rate of the time constants of averaging blocks 13 and 19 included between, for example, 10 and 30.

In a practical example of implementation, applied to standard V27 and for a rate of 2400 bits per second, the value of coefficients k and k' of averaging blocks 3 and 9 is respectively about 0.05 and 0.002. The averaging blocks thus respectively have a time constant of about 10 ms and 200 ms. The threshold values of comparators C1, C2, C3, C4 are for example respectively −39 dBm, −44 dBm, −47 dBm and −52 dBm. Value m for initializing counter CNT, determined with respect to the time constant of the slow averaging block 9, is 1000.

Figure 4B:
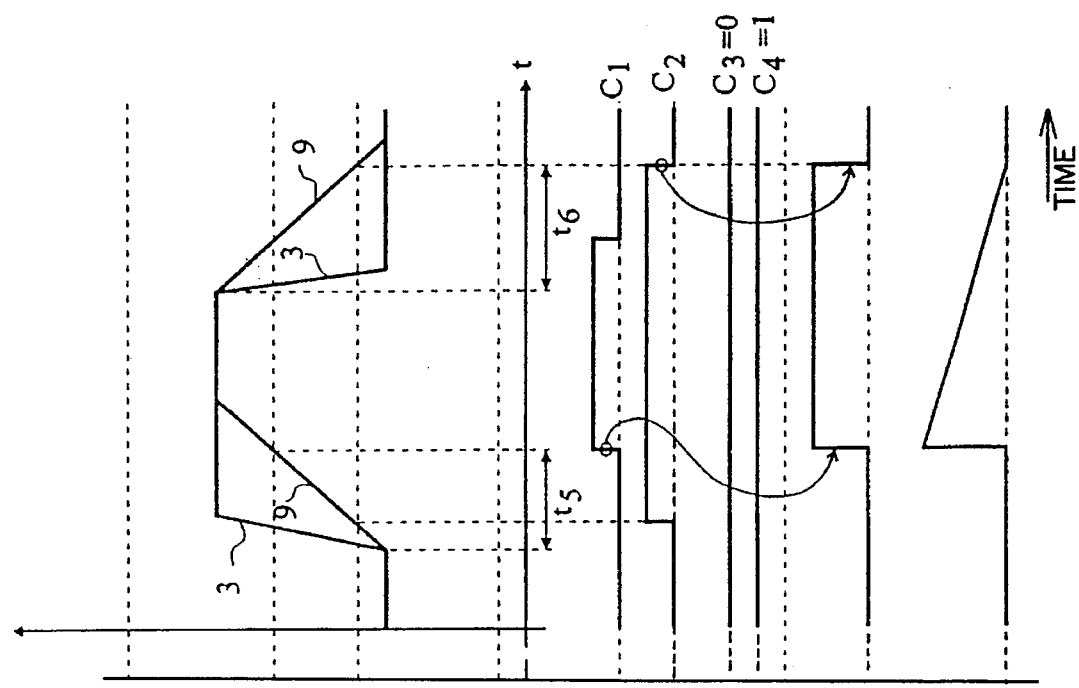
FIGS. 4A and 4B are time diagrams illustrating the waveform of the main signals of an embodiment of a detector according to the invention.
Figure 4A:
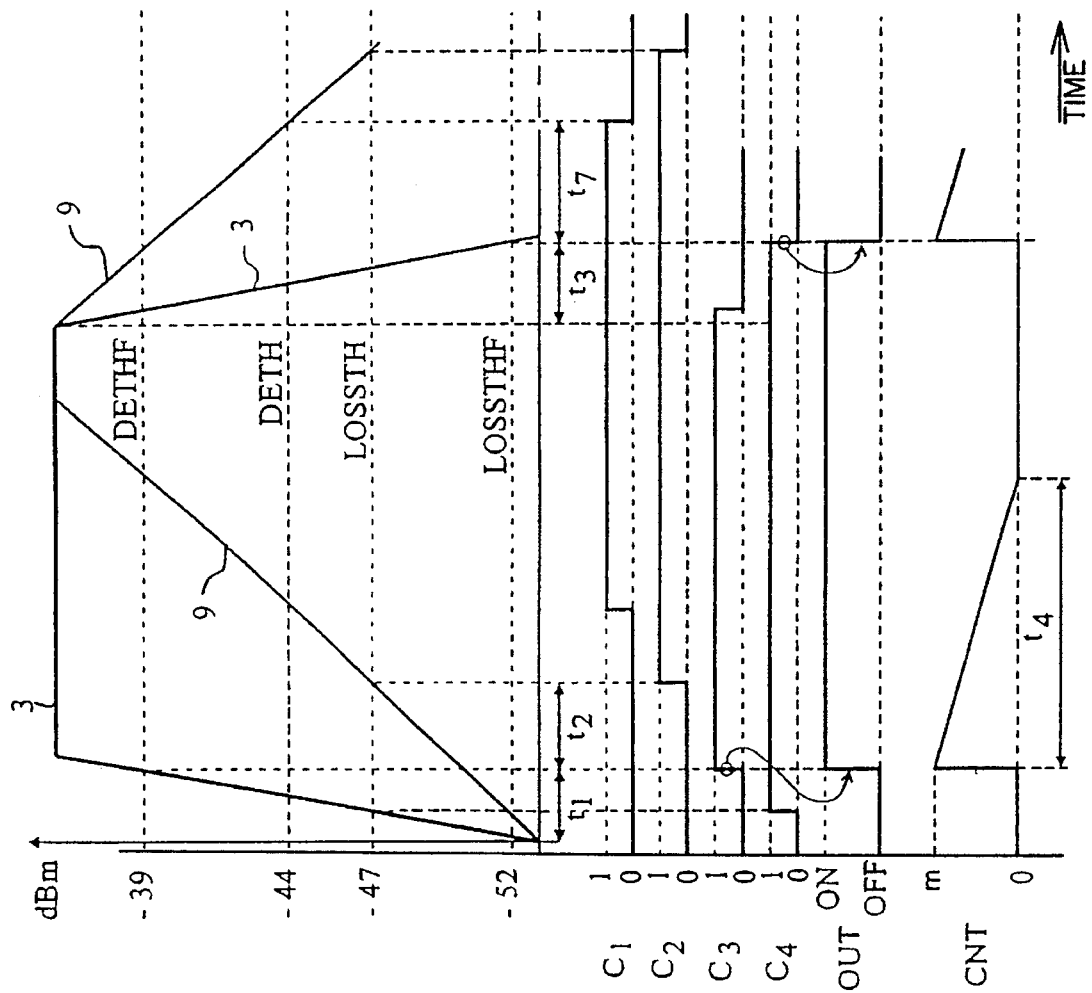

FIGS. 4A and 4B are time diagrams illustrating the operation of such a detector according to the invention. These Figs. indicate the waveform of the output signals of averaging blocks 43 and 49, the waveform of the output signals of comparators 44, 45, 46, 47, the waveform of the OUT detection signal issued by state machine 4' and the evolution of counter CNT. FIG. 4A illustrates the switching processes caused by an overrange of thresholds DETHF and LOSSTHF associated with the fast averaging block 13. FIG. 4B illustrates the switching processes due to the slow averaging block 19 between thresholds DETHF and LOSSTHF. For reasons of clarity of the drawing, the sinusoidal receive signal Rx as well as the output signal of the circuit 12 for determining the absolute value have not been shown. Similarly, the drawings are not to scale for the sake of clarity. Particularly, the difference between the slopes of averaging blocks 43 and 49 is greater in the practice. The time diagram of the OUT detection signal as shown in FIGS. 4A and 4B conforms with the block diagram of FIG. 3.

If it is assumed (FIG. 4A) that the absolute value of the receive signal abruptly changes from a level lower than threshold LOSSTHF to a level higher than threshold DETHF, the output of the fast averaging block 43 reaches threshold DETHF within a time t1. Comparator 46 then provokes the switching of the OUT detection signal towards its ON state and counter CNT is initialized at value m. As long as the counter has not reached a value of 0, the output of comparator 45 is not taken into account and the OUT detection signal remains in its ON state, provided the output of the fast averaging block 43 remains greater than threshold LOSSTHF of comparator 47.

Here, the role of counter CNT clearly appears. Indeed, in the absence of the counter, the outputs of comparator 45 would be examined as soon as the detection signal would be in its ON state. As comparator 45 is associated with the slow averaging block 49, its output cannot have already switched at the time when the OUT detection signal changes to its ON state. As a consequence, the OUT detection signal would oscillate between its two ON and OFF states for a time t2, i.e. until the output of the slow averaging block 49 reached the switching threshold LOSSTH of comparator 45.

This also applies to comparators 47 and 45 when the output level of the circuit for determining the absolute value abruptly drops to a level inferior to threshold LOSSTHF. The output of the fast averaging block 43 reaches threshold LOSSTHF in a time t3. Comparator 47 then provokes the switching of the OUT detection signal towards its OFF state and counter CNT is reinitialized at value m.

Value m for initializing counter CNT is selected so that the time t4 it takes to be decremented to 0 be longer than the time t2 or t7 that the slow averaging block 49 needs to respectively reach one of thresholds LOSSTH or DETH after a switching of comparator 46 or 47.

The times t1 and t3 are linked to the time constant of the fast averaging block 43 and determine the switching times of the detector.

It is now assumed (FIG. 4B) that the absolute value of the receive signal is at a level between thresholds LOSSTHF and LOSSTH and changes to a level included between DETH and DETHF. The outputs of comparators 56 and 57 are respectively on 0 and 1 and are thus not taken into account. After a time t5, the output of the slow averaging block 59 reaches threshold DETH. Comparator 54 then provokes the switching of the OUT detection signal towards its ON state and counter CNT is reinitialized at value m. As long as the counter does not reach value 0, the output of comparator C2 is not taken into account and the OUT detection signal remains in its ON state.

This also applies to comparator 55 when the output level of the circuit for determining the absolute value falls again to a level lower than threshold LOSSTH again. The output of the slow averaging block 59 reaches threshold LOSSTH in a time t6. Comparator 55 then provokes the switching of the OUT detection signal towards its OFF state and counter CNT is reinitialized at value m.

Times t5 and t6 are linked to the time constant of the slow averaging block 59 and here determine the switching times of the detector.

However, in a case such as that of FIG. 4B, the presence of counter CNT is not absolutely necessary. As a matter of fact, only the switching processes linked to the slow averaging block 59 are examined. In other words, once counter CNT has reached the value 0 after a switching of the OUT detection signal triggered by one of the extreme comparators 56 or 57, counter CNT can be reinitialized only in a new switching linked to one of said extreme comparators 56 or 57.

The present invention has various alterations and modifications which will occur to one skilled in the art. For example, each of the described components can be replaced by one or several elements performing the same function. Furthermore, although the foregoing description includes an analog embodiment of the invention, it should be clear to one skilled in the art that each element of the present invention can be replaced with corresponding digital elements or software implementations.

Having thus described at least one illustrative embodiment of the invention, various alterations, modifications and improvements will readily occur to one skilled in the art. Such alterations, modifications and improvements are intended to be within the spirit and scope of the invention. Accordingly, the foregoing description is by way of example only and is not intended to be limiting. The invention is limited only as defined in the following claims and the equivalent thereto.

What is claimed is:

1. A detector of the presence of a modem transmission, comprising:

an absolute value circuit that receives a modem signal and determines an absolute value of the modem signal;

a first averaging circuit, having an input coupled to the absolute value circuit and an output, that generates a first average of the absolute value of the modem signal over a first time period;

a first pair of comparators, each having an input coupled to the output of the first averaging circuit, that respectively compare the first average of the absolute value of the modem signal against a first pair of predetermined thresholds that includes a first upper threshold and a first lower threshold, the first upper threshold establishing a detection of a modem transmission and lower threshold establishing an absence of a modem transmission;

a second averaging circuit, having an input coupled to the absolute value circuit and an output, that generates a second average of the absolute value of the modem signal over a second time period that is shorter than the first time period; and a second pair of comparators, each having an input coupled to the output of the second averaging circuit, that respectively compare the second average of the absolute value of the modem signal to a second pair of predetermined thresholds that includes a second upper threshold and a second lower threshold, the second upper threshold being greater than the first upper threshold, the second lower threshold being less than the first lower threshold.

2. The detector of the presence of a modem transmission according to claim 1, further comprising a state machine that asserts a detection signal when the modem transmission is detected and deasserts the detection signal when an absence of the modem transmission is detected, the state machine having an input coupled to each of the first and second pairs of comparators;

wherein the state machine asserts the detection signal when the second pair of comparators indicates that the second average of the absolute value of the modem signal is greater than the second upper threshold, and when the second pair of comparators indicates that the second average of the absolute value of the modem signal is less than second upper threshold and the first pair of comparators indicates that the first average of the absolute value of the modem signal is greater than the first upper threshold; and wherein the state machine deasserts the detection signal when the second pair of comparators indicates that the second average of the absolute value of the modem signal is less than the second lower threshold, and when the second pair of comparators indicates that the second average of the absolute value of the modem signal is greater than the second lower threshold and the first pair of comparators indicates that the first average of the absolute value of the modem signal is less than the first lower threshold.

3. The detector of the presence of a modem transmission according to claim 1, further including a first multiplier, having an input coupled to the absolute value circuit and an output, that multiplies the absolute value of the modem signal by first constant having a value equal to less than one to generate a first multiplied signal; and wherein the first averaging circuit includes;

a first integrator, having a first input coupled to the output of the first multiplier, a second input, and an output, that integrates a difference between signals received at its first and second inputs over an integration time period to generate a first integrated signal;

a first delay circuit, having an input coupled to the output of the first integrator and an output, that receives the first integrated signal and outputs the first integrated signal delayed by a first delay period that is approximately equal to the first time period, the output of the first delay circuit being the output of the first averaging circuit; and a second multiplier, having an input coupled to the output of the first delay circuit and an output coupled to the second input of the first integrator, that multiplies the first integrated signal by a second constant that has a value approximately equal to one minus the first constant to generate a second multiplied signal; and wherein the second averaging circuit includes;

a second integrator, having a first input coupled to the output of the first multiplier, a second input, and an output, that integrates a difference between signals received at its first and second inputs over a second integration time period to generate a second integrated signal;

a second delay circuit, having an input coupled to the output of the second integrator and an output, that receives the second integrated signal and outputs the second integrated signal delayed by a second delay period that is approximately equal to the second time period, the output of the second delay circuit being the output of the second averaging circuit; and a third multiplier, having an input coupled to the output of the second delay circuit and an output coupled to the second input of the second integrator, that multiplies the second integrated signal by the second constant to generate a third multiplied signal.

4. The detector of the presence of a modem transmission according to claim 1, wherein the first time period is approximately 10 to 30 times greater than the second time period.

5. The detector of the presence of a modem transmission according to claim 1, wherein the transmission signal is a modulated signal and the first and second averages of the absolute value of the modem signal each has a ripple having a maximum amplitude, and wherein a difference between the first and second upper thresholds and a difference between the first and second lower thresholds each is equal to at least a difference between the maximum amplitudes of the ripples of the first and second averages of the absolute value of the modem signal.

6. The detector of the presence of a modem transmission according claim 1, wherein the first time period is in a range of approximately 100 to 300 ms and the second time period is in a range of approximately 5 and 15 ms.

7. The detector of the presence of a modem transmission according to claim 6, wherein the first upper threshold is greater than the first lower threshold by at least 2 dB.

8. The detector of the presence of a modem transmission according to claim 2, further including a first multiplier, having an input coupled to the absolute value circuit and an output, that multiplies the absolute value of the modem signal by first constant having a value equal to less than one to generate a first multiplied signal; and wherein the first averaging circuit includes;
a first integrator, having a first input coupled to the output of the first multiplier, a second input, and an output, that integrates a difference between signals received at its first and second inputs over an integration time period to generate a first integrated signal;
a first delay circuit, having an input coupled to the output of the first integrator and an output, that receives the first integrated signal and outputs the first integrated signal delayed by a first delay period that is approximately equal to the first time period, the output of the first delay circuit being the output of the first averaging circuit;
a second multiplier, having an input coupled to the output of the first delay circuit and an output coupled to the second input of the first integrator, that multiplies the first integrated signal by a second constant that has a value approximately equal to one minus the first constant to generate a second multiplied signal; and wherein the second averaging circuit includes;
a second integrator, having a first input coupled to the output of the first multiplier, a second input, and an output, that integrates a difference between signals received at its first and second inputs over a second integration time period to generate a second integrated signal;
a second delay circuit, having an input coupled to the output of the second integrator and an output, that receives the second integrated signal and outputs the second integrated signal delayed by a second delay period that is approximately equal to the second time period, the output of the second delay circuit being the output of the second averaging circuit; and
a third multiplier, having an input coupled to the output of the second delay circuit and an output coupled to the second input of the second integrator, that multiplies the second integrated signal by the second constant to generate a third multiplied signal.

9. The detector of the presence of a modem transmission according to claim 2, wherein the first time period is approximately 10 to 30 times greater than the second time period.

10. The detector of the presence of a modem transmission according to claim 2, wherein the transmission signal is a modulated signal and the first and second averages of the absolute value of the modem signal each has a ripple having a maximum amplitude, and wherein a difference between the first and second upper thresholds and a difference between the first and second lower thresholds each is equal to at least a difference between the maximum amplitudes of the ripples of the first and second averages of the absolute value of the modem signal.

11. The detector of the presence of a modem transmission according claim 4, wherein the first time period is in a range of approximately 100 to 300 ms and the second time period is in a range of approximately 5 and 15 ms.

12. The detector of the presence of a modem transmission according to claim 6, wherein the second upper threshold is greater than the second lower threshold by at least 2 dB.

13. A circuit for determining when a transmission signal is received at a device input, the circuit comprising:
at least one averaging circuit, coupled to the device input, that generates an average signal representing an average of a signal received at the device input, the at least one averaging circuit having an output that outputs the average signal;
a first pair of comparators, each having an input coupled to the output of the at least one averaging circuit, that respectively compare the average signal against a first pair of predetermined thresholds that includes a first upper threshold and a first lower threshold;
a second pair of comparators, each having an input coupled to the output of the at least one averaging circuit, that respectively compare the average signal to a second pair of predetermined thresholds that includes a second upper threshold and a second lower threshold, the second upper threshold being greater than the first upper threshold, the second lower threshold being less than the first lower threshold; and
a controller, having an input coupled to each of the first and second pairs of comparators and an output, that asserts-a reception signal indicating that the transmission signal is received at the device input when the average signal is greater than the first upper threshold and when the average signal is less than the first upper threshold and greater than the second upper threshold, and that deasserts the reception signal when the average signal is less than the first lower threshold and when the average signal is greater than the first lower threshold and less than the second lower threshold.

14. The circuit of claim 13, wherein the at least one averaging circuit includes:
a first averaging circuit, coupled to the device input, that generates a first average signal representing a first average of the signal received at the device input over a first time period, the first averaging circuit having an output coupled to the first pair of comparators that provides the first average signal to the first pair of comparators; and
a second averaging circuit, that generates a second average signal representing a second average of the signal received at the device input over a second time period that is greater than the first time period, the second averaging circuit having an output coupled to the second pair of comparators that provides the second average signal to the second pair of comparators.

15. The circuit of claim 13, wherein:

the controller includes a delay circuit that establishes a delay period;

the controller asserts the reception signal for a duration equal to at least the delay period when the average signal transitions from a value less than the first upper threshold to a value greater than the first upper threshold and remains greater than the first lower threshold; and the controller deasserts the reception signal for a duration equal to at least the delay period when the average signal transitions from a value greater than the first lower threshold to a value less than the first lower threshold and remains less than the first upper threshold.

16. The circuit of claim 13, wherein the controller includes:

a delay circuit that establishes a delay period;

means for asserting the reception signal for a duration equal to at least the delay period when the average signal transitions from a value less than the first upper threshold to a value greater than the first upper threshold and remains at a value greater than the first lower threshold; and means for deasserting the reception signal for a duration equal to at least the delay period when the average signal transitions from a value greater than the first lower threshold to a value less than the first lower threshold and remains at a value less than the first upper threshold.

17. The circuit of claim 15, wherein:

the controller asserts the reception signal for a duration equal to at least the delay period when the average signal transitions from a value less than the second upper threshold to a value greater than the second upper threshold and remains between the first pair of thresholds; and the controller deasserts the reception signal for a duration equal to at least the delay period when the average signal transitions from a value greater than the second lower threshold to a value less than the second lower threshold and remains between the first pair of thresholds.

18. The circuit of claim 16, wherein the controller includes:

means for asserting the reception signal for a duration equal to at least the delay period when the average signal transitions from a value less than the second upper threshold to a value greater than the second upper threshold and remains at a value between the first pair of thresholds; and means for deasserting the reception signal for a duration equal to at least the delay period when the average signal transitions from a value greater than the second lower threshold to a value less than the second lower threshold and remains at a value between the first pair of thresholds.

19. The circuit of claim 13, including an absolute value circuit, coupled between the device input and the at least one averaging circuit, that generates an absolute value signal that represents the absolute value of the input signal and that provides the absolute value signal to the at least one averaging circuit.

20. The circuit of claim 14, including an absolute value circuit, coupled between the device input and the first and second averaging circuits, that generates an absolute value signal that represents the absolute value of the input signal and that provides the absolute value signal to the first and second averaging circuits.

21. The circuit of claim 14, wherein the first time period is approximately 10 to 30 times shorter than the second time period.

22. The circuit of claim 14, wherein the first average signal has a first ripple having a maximum amplitude and the second average signal has a second ripple having a maximum amplitude, and wherein a difference between the first and second upper thresholds is equal to at least a difference between the maximum amplitude of the first ripple and the maximum amplitude of the second ripple, and wherein a difference between the first and second lower thresholds is equal to at least the difference between the maximum amplitude of the first ripple and the maximum amplitude of the second ripple.

23. A system, comprising:

a modem having an input;

a detection circuit for detecting whether a transmission signal is received at the modem input, the detection circuit including;

at least one averaging circuit, coupled to the modem input, that generates an average of a modem signal received at the modem input, the at least one averaging circuit having an output that outputs an average signal representing an average of the modem signal;

a first pair of comparators, each having an input coupled to the output of the at least one averaging circuit, that respectively compare the average signal against a first pair of predetermined thresholds that includes a first upper threshold and a first lower threshold;

a second pair of comparators, each having an input coupled to the output of the at least one averaging circuit, that respectively compare the average signal to a second pair of predetermined thresholds that includes a second upper threshold and a second lower threshold, the second upper threshold being greater than the first upper threshold, the second lower threshold being less than the first lower threshold; and a controller, having an input coupled to each of the first and second pair of comparators and an output, that asserts a reception signal indicating that the transmission signal is received by the modem when the average signal is greater than the first upper threshold and when the average signal is less than the first upper threshold and greater than the second upper threshold, and that deasserts the reception signal when the average signal is less than the first lower threshold and when the average signal is greater than the first lower threshold and less than the second lower threshold.

24. The system of claim 23, wherein the at least one averaging circuit further includes:

a first averaging circuit, coupled to the modem input, that generates a first average signal representing a first average of the modem signal over a first time period, the first averaging circuit having an output coupled to the first pair of comparators that provides the first average signal to the first pair of comparators; and a second averaging circuit, coupled to the modem input, that generates a second average signal representing a second average of the modem signal over a second period time period that is greater than the first time period, the second averaging circuit having an output coupled to the second pair of comparators that provides the second average signal to the second pair of comparators.

25. The system of claim 24, wherein the first time period is approximately 10 to 30 time less than the second time period.

26. The system of claim 24, wherein the first time period is in a range of 5 and 15 ms and the second time period is in a range of 100 and 300 ms.

27. The system of claim 24, wherein the first average signal has a first ripple having a maximum amplitude and the second average signal has a second ripple having a maximum amplitude, and wherein a difference between the first and second upper thresholds is equal to at least a difference between the maximum amplitude of the first ripple and the maximum amplitude of the second ripple, and wherein a difference between the first and second lower thresholds is equal to at least the difference between the maximum amplitude of the first ripple and the maximum amplitude of the second ripple.

28. The system of claim 23, wherein the first upper threshold is at least 2 dB greater than the first lower threshold.

29. The system of claim 23, wherein the second upper threshold is at least 2 dB greater than the second lower threshold.

30. The system of claim 24, wherein the first upper threshold is at least 2 dB greater than the first lower threshold.

31. The system of claim 24, wherein the second upper threshold is at least 2 dB greater than the second lower threshold.

32. The system of claim 23, further including an absolute value circuit, coupled between the modem input and the at least one averaging circuit, that generates an absolute value of the modem signal and that provides the absolute value of the modem signal to the at least one averaging circuit.

33. The system of claim 24, further including an absolute value circuit, coupled between the modem input and the first and second averaging circuits, that generates an absolute value of the modem signal and that provides the absolute value of the modem signal to the first and second averaging circuits.

34. A method for determining whether a transmission signal is received at a device input, the method comprising the steps of:

(A) comparing an energy of a signal at the device input against a first pair of predetermined thresholds that includes a first upper threshold and a first lower threshold;

(B) when the energy of the signal at the device input is greater than the first upper threshold, indicating that the transmission signal is received at the device input;

(C) when the energy of the signal at the device input is less than the first lower threshold, indicating that the transmission signal is not received at the device input; and (D) when the energy of the signal at the device input is between the first upper threshold and the first lower threshold, performing the steps of;

comparing the energy of the signal at the device input against a second pair of predetermined thresholds that includes a second upper threshold and a second lower threshold;

when the energy of the signal at the device input is greater than the second upper threshold, indicating that the transmission signal is received at the device input; and when the energy of the signal at the device input is less than the second lower threshold, indicating that the transmission signal is not received at the device input.

35. The method of claim 34, wherein steps (A) and (D) include a step of setting the first and second upper thresholds so that the second upper threshold has a value less than the first upper threshold, and a step of setting the first and second lower thresholds such that the second lower threshold has a value greater than the first lower threshold.

36. The method of claim 35, wherein the first pair of predetermined thresholds defines a first range of values between the first upper threshold and the first lower threshold, and wherein the method further includes a step of:

when the energy of the signal at the device input transitions from a value within the first range to a value outside the first range, delaying by a predetermined delay period before proceeding to step (D).

37. The method of claim 36, wherein the second pair of predetermined thresholds defines a second range of values between the second upper threshold and the second lower threshold, and wherein step (D) includes a step of:

when the energy of the signal at the device input transitions from a value within the second range to a value outside the second range and the first average signal has a value within the first range, delaying by the predetermined delay period before proceeding to the step of comparing the energy of the signal at the device input against the second pair of thresholds.

38. The method of claim 34, wherein step (A) includes a step of generating a first average signal that represents an average energy of the signal at the device input over a first time period and comparing the first average signal against the first pair of predetermined thresholds and step (D) includes a step of generating a second average signal that represents an average energy of the signal at the device input over a second time period and comparing the second average signal against the second pair of thresholds, wherein the first time period is longer than the first time period.

39. The method of claim 38, wherein the device is a modem and steps (A) and (D) include steps of setting the first and second time periods so that the second time period is approximately 10 to 30 times longer than the first time period.

40. The method of claim 38, wherein the device is a modem, and wherein step (A) includes a step of setting the first time period to be within in a range of 5 to 15 ms, and step (D) includes a step of setting the second time period to be within in a range of 100 to 300 ms.

41. The method of claim 38, wherein steps (A) and (D) include a step of setting the first and second upper thresholds so that the second upper threshold is less than the first upper threshold, and a step of setting first and second lower thresholds so that the second lower threshold is greater than the first lower threshold.

42. The method of claim 38, wherein the device is a modem and the first average signal has a first ripple having a maximum amplitude and the second average signal has a second ripple having a maximum amplitude, and wherein steps (A) and (D) include a step of setting the first and second upper thresholds so that a difference between the first and second upper thresholds is equal to at least a difference between the maximum amplitude of the first ripple and the maximum amplitude of the second ripple, and a step of setting the first and second lower thresholds so that a difference between the first lower and second lower thresholds is equal to at least the difference between the maximum amplitude of the first ripple and the maximum amplitude of the second ripple.

43. The method of claim 34, wherein the device is a modem and wherein step (A) includes a step of setting the first upper threshold to a value that is at least 2 dB greater than the first lower threshold.

44. The method of claim 34, wherein the device is a modem and step (D) includes a step of setting the second upper threshold to a value that is at least 2 dB greater than the second lower threshold.

45. The method of claim 38, wherein the device is a modem and wherein step (A) includes a step of setting the first upper threshold to a value that is at least 2 dB greater than the first lower threshold.

46. The method of claim 38, wherein the device is a modem and step (D) includes a step of setting the second upper threshold to a value that is at least 2 dB greater than the second lower threshold.

47. A circuit that determines when a transmission signal is received at a device input, comprising:

first means for comparing an energy of an input signal received at the device input against a first pair of predetermined thresholds that includes a first upper threshold and a first lower threshold:

second means for comparing the energy of the input signal received at the device input against a second pair of predetermined thresholds that includes a second upper threshold that is less than the first upper threshold and a second lower threshold that is greater than the first lower threshold; and control means, coupled to the first and second means, for asserting a reception signal indicating that the transmission signal is received at the device input when the energy of the input signal is greater than the first upper threshold and when the energy of the input signal is less than the first upper threshold and greater than the second upper threshold, and for deasserting the reception signal when the energy of the input signal is less than the first lower threshold and when the energy of the input signal is greater than the first lower threshold and less than the second lower threshold.

48. The circuit of claim 47, wherein:

the first means includes first averaging means for generating a first average signal representing a first average of the energy of the input signal over a first period time period and means for comparing the first average signal against the first pair of predetermined thresholds; and the second means includes second averaging means for generating a second average signal representing a second average of the energy of the input signal over a second period time period that is longer than the first time period and means for comparing the second average signal against the second pair of predetermined thresholds.

49. The circuit of claim 48, wherein the control means includes:

means for establishing a delay period;

means for asserting the reception signal for a time period equal to at least the delay period when the first average signal transitions from a value less than the first upper threshold to a value greater than the first upper threshold and remains greater than the first lower threshold; and means for deasserting the reception signal for a time period equal to at least the delay period when the first average signal transitions from a value greater than the first lower threshold to a value less than the first lower threshold and remains less than the first upper threshold.

50. The circuit of claim 49, wherein the control means further includes:

means for asserting the reception signal for a time period equal to at least the delay period when the second average signal transitions from a value less than the second upper threshold to a value greater than the second upper threshold and the first average signal remains between the first pair of predetermined thresholds; and means for deasserting the reception signal for a time period equal to at least the delay period when the second average signal transitions from a value greater than the second lower threshold to a value less than the second lower threshold and the first average signal remains between first pair of predetermined thresholds.

51. The circuit of claim 48, wherein the device is a modem and first time period is approximately 10 to 30 times shorter than the second time period.

52. The circuit of claim 48, wherein the device is a modem and the first time period is in a range of 5 to 15 ms and the second time period is in a range of 100 to 300 ms.

53. The circuit of claim 48, wherein the device is a modem and the first average signal has a first ripple having a maximum amplitude and the second average signal has a second ripple having a maximum amplitude, and wherein a difference between the first and second upper thresholds is equal to at least a difference between the maximum amplitude of the first ripple and the maximum amplitude of the second ripple, and wherein a difference between the first and second lower thresholds is equal to at least the difference between the maximum amplitude of the first ripple and the maximum amplitude of the second ripple.

54. The circuit of claim 47, wherein the device is a modem and the first upper threshold is at least 2 dB greater than the first lower threshold.

55. The circuit of claim 47, wherein the device is a modem and the second upper threshold is at least 2 dB greater than the second lower threshold.

* * * * *